(12) United States Patent
Sun et al.

(10) Patent No.: US 11,316,011 B2
(45) Date of Patent: Apr. 26, 2022

(54) ERASABLE PROGRAMMABLE NON-VOLATILE MEMORY

(71) Applicant: eMemory Technology Inc., Hsin-Chu (TW)

(72) Inventors: Wein-Town Sun, Hsinchu County (TW); Chun-Hsiao Li, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 17/095,855

(22) Filed: Nov. 12, 2020

(65) Prior Publication Data

US 2021/0183876 A1 Jun. 17, 2021

Related U.S. Application Data

(60) Provisional application No. 62/946,432, filed on Dec. 11, 2019.

(51) Int. Cl.
| | |
|---|---|
| *G11C 16/10* | (2006.01) |
| *H01L 29/06* | (2006.01) |
| *H01L 29/792* | (2006.01) |
| *G11C 16/34* | (2006.01) |
| *H01L 29/423* | (2006.01) |
| *G11C 16/04* | (2006.01) |
| *H01L 27/11563* | (2017.01) |
| *G11C 16/14* | (2006.01) |
| *G11C 16/26* | (2006.01) |

(Continued)

(52) U.S. Cl.
CPC ...... *H01L 29/0653* (2013.01); *G11C 16/0425* (2013.01); *G11C 16/0466* (2013.01); *G11C 16/10* (2013.01); *G11C 16/14* (2013.01); *G11C 16/26* (2013.01); *G11C 16/34* (2013.01); *H01L 27/11524* (2013.01); *H01L 27/11563* (2013.01); *H01L 29/4234* (2013.01); *H01L 29/7885* (2013.01); *H01L 29/792* (2013.01)

(58) Field of Classification Search
CPC .................................................. H01L 27/11524
USPC ....................................................... 257/315
See application file for complete search history.

(56) References Cited

U.S. PATENT DOCUMENTS

| | | |
|---|---|---|
| 6,690,057 B1 | 2/2004 | Frerichs |
| 7,880,217 B2 | 2/2011 | Sung et al. |

(Continued)

OTHER PUBLICATIONS

Office Action issued by Taiwan Intellectual Property Office dated Apr. 28, 2021.

*Primary Examiner* — Jason Lappas
(74) *Attorney, Agent, or Firm* — WPAT, PC

(57) ABSTRACT

An erasable programmable non-volatile memory includes a first-type well region, three doped regions, two gate structures, a blocking layer and an erase line. The first doped region is connected with a source line. The third doped region is connected with a bit line. The first gate structure is spanned over an area between the first doped region and the second doped region. A first polysilicon gate of the first gate structure is connected with a select gate line. The second gate structure is spanned over an area between the second doped region and the third doped region. The second gate structure includes a floating gate and the floating gate is covered by the blocking layer. The erase line is contacted with the blocking layer. The erase line is located above an edge or a corner of the floating gate.

10 Claims, 6 Drawing Sheets

(51) Int. Cl.
*H01L 27/11524* (2017.01)
*H01L 29/788* (2006.01)

(56) References Cited

U.S. PATENT DOCUMENTS

| | | |
|---|---|---|
| 8,941,167 B2 | 1/2015 | Chen et al. |
| 2007/0228451 A1* | 10/2007 | Georgescu .......... H01L 29/7883 438/257 |
| 2013/0256773 A1 | 10/2013 | Pan et al. |

* cited by examiner

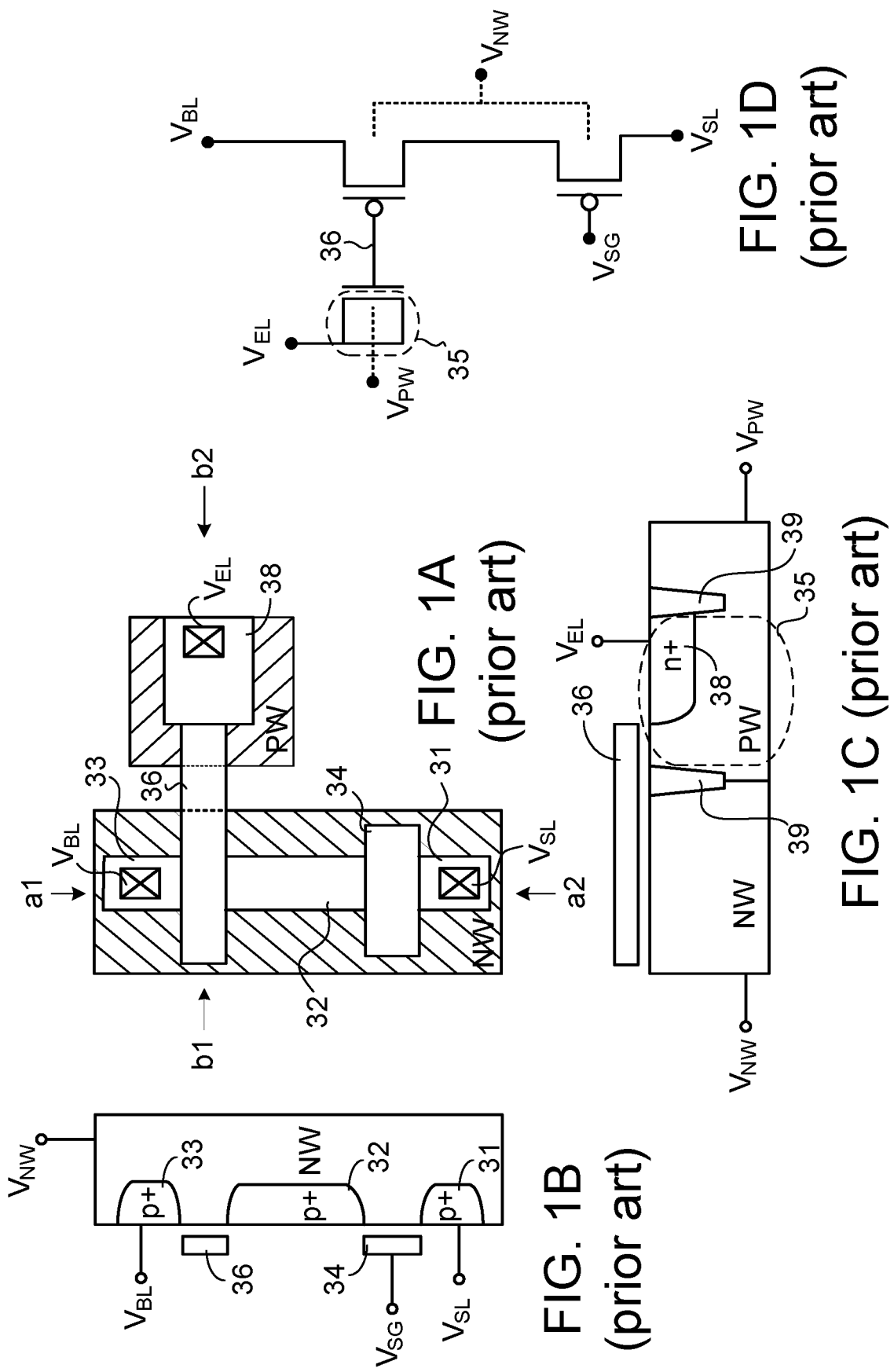

ERASABLE PROGRAMMABLE NON-VOLATILE MEMORY

This application claims the benefit of U.S. provisional application Ser. No. 62/946,432, filed Dec. 11, 2019, the subject matter of which is incorporated herein by reference.

FIELD OF THE INVENTION

The present invention relates to a non-volatile memory, and more particularly to an erasable programmable non-volatile memory.

BACKGROUND OF THE INVENTION

FIGS. 1A~1D schematically illustrate the structure of a memory cell of a conventional erasable programmable non-volatile memory and the equivalent circuit. For example, the conventional erasable programmable non-volatile memory is disclosed in U.S. Pat. No. 8,941,167.

FIG. 1A is a schematic top view of a conventional non-volatile memory. FIG. 1B is a schematic cross-sectional view illustrating the conventional non-volatile memory of FIG. 1A and taken along a first direction (a1-a2). FIG. 1C is a schematic cross-sectional view illustrating the non-volatile memory of FIG. 1A and taken along a second direction (b1-b2). FIG. 1D is a schematic equivalent circuit diagram of the conventional non-volatile memory.

As shown in FIGS. 1A and 1B, the memory cell of the conventional non-volatile memory comprises two serially-connected p-type transistors. These two p-type transistors are constructed in an n-well region (NW). Three p-type doped regions 31, 32 and 33 are formed in the n-well region (NW). In addition, two polysilicon gates 34 and 36 are spanned over the areas between the three p-type doped regions 31, 32 and 33.

The first p-type transistor is used as a select transistor, and the polysilicon gate 34 (also referred as a select gate) of the first p-type transistor is connected to a select gate voltage $V_{SG}$. The p-type doped region 31 is connected to a source line voltage $V_{SL}$. The p-type doped region 32 is a combination of a p-type doped drain region of the first p-type transistor and a p-type doped region of the second p-type transistor. The second p-type transistor is a floating gate transistor. The polysilicon gate 36 (also referred as a floating gate) is disposed over the second p-type transistor. The p-type doped region 33 is connected to a bit line voltage $V_{BL}$. Moreover, the n-well region (NW) is connected to an n-well voltage $V_{NW}$.

As shown in FIGS. 1A and 1O, the conventional non-volatile memory further comprises an n-type transistor. The n-type transistor is composed of the floating gate 36 and an erase gate region 35. The n-type transistor is constructed in a p-well region (PW). An n-type doped region 38 is formed in the p-well region (PW). That is, the erase gate region 35 contains the p-well region (PW) and the n-type doped region 38.

As shown in FIG. 1A, the floating gate 36 is extended externally and located near the erase gate region 35. Consequently, the floating gate 36 is also the gate terminal of the n-type transistor. Moreover, the n-type doped region 38 may be considered as a combination of an n-type doped source region and an n-type doped drain region. The n-type doped region 38 is connected to an erase line voltage $V_{EL}$. In addition, the p-well region (PW) is connected to a p-well voltage $V_{PW}$. As shown in FIG. 1C, the erase gate region 35 and the n-well region (NW) are isolated from each other by an isolation structure 39. For example, the isolation structure 39 is a shallow trench isolation (STI) structure.

As shown in the equivalent circuit of FIG. 1D, the memory cell of the non-volatile memory comprises a select transistor, a floating gate transistor and an n-type transistor. The select transistor and the floating gate transistor are p-type transistors and constructed in the n-well region (NW). The n-well region (NW) receives the n-well voltage $V_{NW}$. The n-type transistor is constructed in the p-well region (PW). In addition, the p-well region (PW) receives the p-well voltage $V_{PW}$.

The select gate of the select transistor receives the select gate voltage $V_{SG}$. The first source/drain terminal of the select transistor receives the source line voltage $V_{SL}$. The first source/drain terminal of the floating gate transistor is connected with the second source/drain terminal of the select transistor. The second source/drain terminal of the floating gate transistor receives the bit line voltage $V_{BL}$. The gate terminal of the n-type transistor and the floating gate of the floating gate transistor are connected with each other. The first source/drain terminal of the n-type transistor and the second source/drain terminal of the n-type transistor are connected with each other to receive the erase line voltage $V_{EL}$.

Generally, due to the arrangement of the erase gate region 35, the hot carriers in the floating gate 36 can be ejected from the memory cell during the erase operation. However, since the magnitude of the erase line voltage $V_{EL}$ is very high, a punch-through effect is possibly generated in the substrate of the non-volatile memory. For avoiding the punch-through effect, the isolation structure 39 is designed to have a larger width. In addition, the extension length of the floating gate 36 is increased. Under this circumstance, the size of the memory cell of the non-volatile memory is larger.

SUMMARY OF THE INVENTION

The present invention provides an erasable programmable non-volatile memory with a novel structure and a smaller size.

An embodiment of the present invention provides an erasable programmable non-volatile memory. The erasable programmable non-volatile memory includes a first-type well region, a first doped region, a second doped region, a third doped region, a first gate structure, a second gate structure, a blocking layer and an erase line. The first doped region, the second doped region and the third doped region are formed in a surface of the first-type well region. The first doped region is connected with a source line. The third doped region is connected with a bit line. The first gate structure is spanned over an area between the first doped region and the second doped region. A first polysilicon gate of the first gate structure is connected with a select gate line. The second gate structure is spanned over an area between the second doped region and the third doped region. A second polysilicon gate of the second gate structure is a floating gate. The blocking layer is formed on the second gate structure. A contact hole is formed over the blocking layer and is located above an edge or a corner of the floating gate. A metallic material is filled in the contact hole.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A-1D (prior art) schematically illustrate the structure of a memory cell of a conventional erasable programmable non-volatile memory and the equivalent circuit;

DETAILED DESCRIPTION OF PREFERRED EMBODIMENTS

Figure 2A:
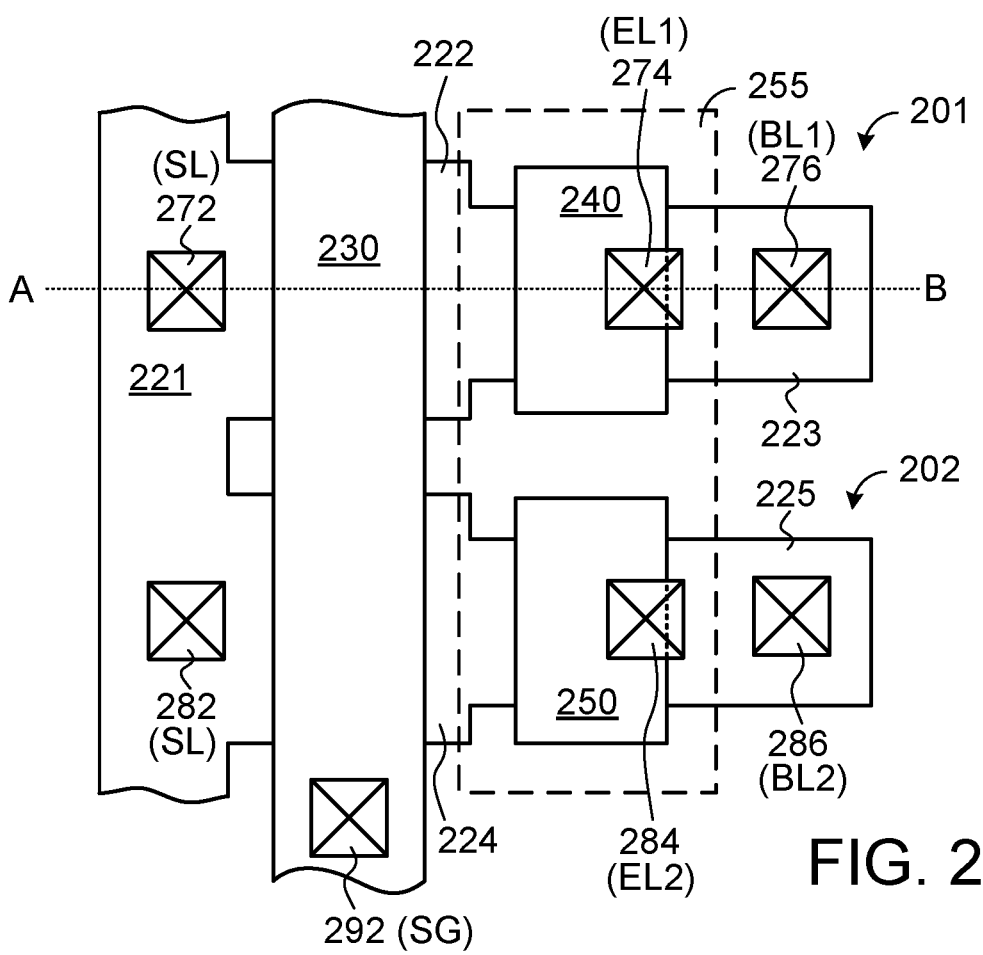
FIG. 2A is a schematic top view illustrating an erasable programmable non-volatile memory according to an embodiment of the present invention.
Figure 2B:
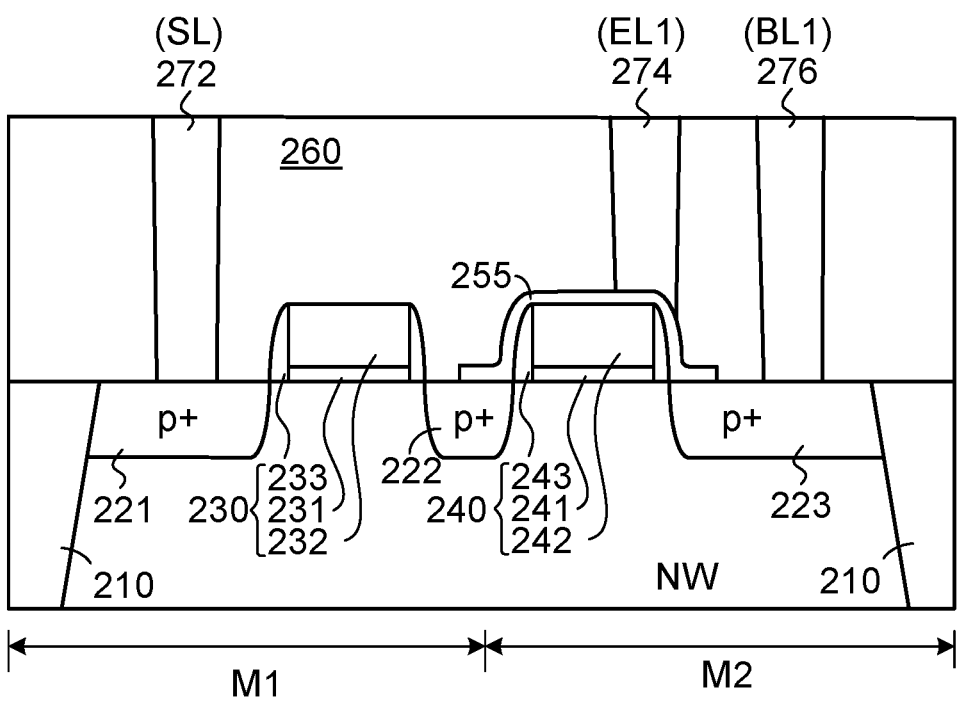
FIG. 2B is a schematic cross-sectional view illustrating the erasable programmable non-volatile memory as shown in FIG. 2A and taken along the line A-B.

Please refer to FIGS. 2A and 2B. FIG. 2A is a schematic top view illustrating an erasable programmable non-volatile memory according to an embodiment of the present invention. FIG. 2B is a schematic cross-sectional view illustrating the erasable programmable non-volatile memory as shown in FIG. 2A and taken along the line A-B.

As shown in FIG. 2A, the erasable programmable non-volatile memory comprises two memory cells 201 and 202. The structures of the two memory cells 201 and 202 are identical. For succinctness, only the structure 201 will be illustrated as follows.

As shown in FIGS. 2A and 2B, the memory cell 201 comprises two serially-connected p-type transistors M1 and M2. The two p-type transistors M1 and M2 are constructed in an n-well region (NW) and arranged within an isolation structure 210. For example, the isolation structure 210 is a shallow trench isolation (STI) structure.

Three p-type doped regions 221, 222 and 223 are formed in the n-well region (NW). Moreover, two gate structures 230 and 240 are spanned over the areas between the p-type doped regions 221, 222 and 223. The gate structure 230 comprises a gate oxide layer 231, a polysilicon gate 232 and a sidewall insulator 233. The gate structure 240 comprises a gate oxide layer 241, a polysilicon gate 242 and a sidewall insulator 243. The sidewall insulators 233 and 243 are spacers.

Moreover, the gate structure 240 of the second p-type transistor M2 are covered by a blocking layer 255. Then, three contact holes are formed in an interlayer dielectric layer 260. After a metallic material is filled in the contact holes, three metal conductor lines 272, 274 and 276 are contacted with the p-type doped region 221, the blocking layer 255 and the p-type doped region 223, respectively.

The first p-type transistor M1 is served as a select transistor. The polysilicon gate 231 of the first p-type transistor M1 is connected with a metal conductor line 292. The metal conductor line 292 is served as a select gate line SG. The p-type doped region 221 is connected with the metal conductor line 272. The metal conductor line is served as a source line SL. The p-type doped region 222 is a combination of a p-type doped drain region of the first p-type transistor M1 and a p-type doped region of the second p-type transistor M2.

The second p-type transistor M2 is served as a floating gate transistor. The polysilicon gate 242 of the second p-type transistor M2 is a floating gate. The p-type doped region 223 of the second p-type transistor M2 is connected with the metal conductor line 276. Moreover, the metal conductor line 276 is served as a bit line BL1.

The metal conductor line 274 is contacted with the blocking layer 255. Moreover, the metal conductor line 274 is served as an erase line EL1. In an embodiment, the blocking layer 255 is a salicide blocking layer. Alternatively, the blocking layer 255 is a silicon dioxide ($SiO_2$) layer, a stack structure comprising a silicon dioxide ($SiO_2$) layer and a silicon nitride (SiNx) layer, or a stack structure comprising a silicon dioxide ($SiO_2$) layer, a silicon nitride (SiNx) layer and a silicon oxynitride (SiON) layer.

In accordance with a feature of the present invention, an opening of the contact hole corresponding to the metal conductor line 274 is located above an edge or a corner of the polysilicon gate 242. After the metal conductor line 274 is filled in the contact hole, the metal conductor line 274 is contacted with the blocking layer 255. In addition, the metal conductor line 274 is located above the edge or the corner of the polysilicon gate 242 and not contacted with the polysilicon gate 242.

Moreover, the memory cell 202 is defined by the n-well region (NW), three p-type doped regions 221, 224, 225, two gate structures 230, 250, the blocking layer 255 and the metal conductor lines 282, 284, 286, 292. The detailed structure of the memory cell 202 is not redundantly described herein.

FIGS. 3A~3D schematically illustrate the bias voltages of the erasable programmable non-volatile memory of the present invention while a program operation, an erase operation and a read operation are performed.

Figure 3A:
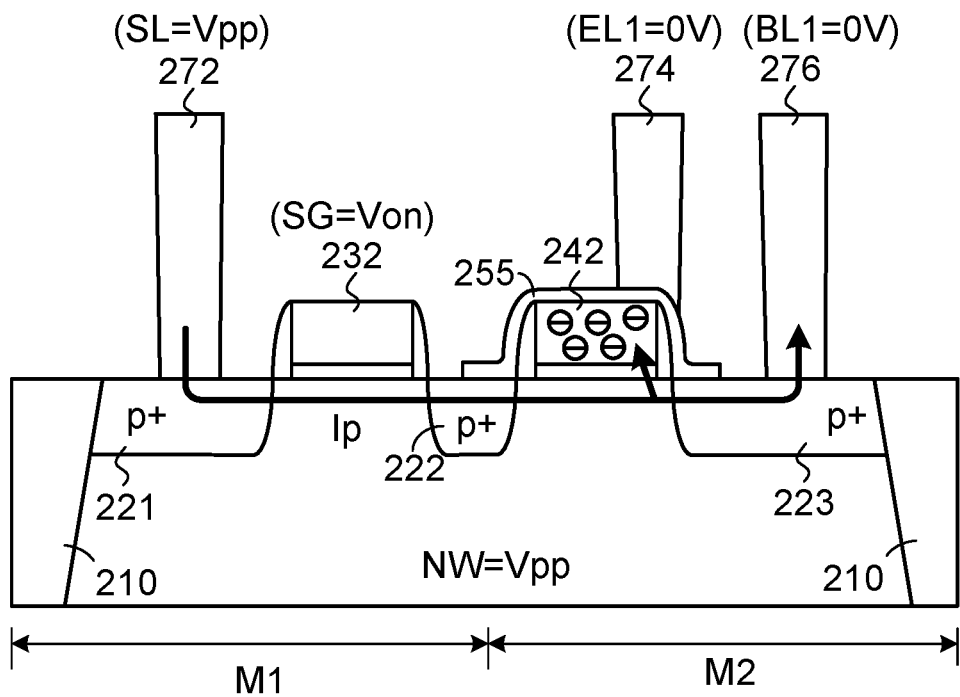
FIGS. 3A-3D schematically illustrate the bias voltages of the erasable programmable non-volatile memory of the present invention while a program operation, an erase operation and a read operation are performed.

Please refer to FIG. 3A. While the program operation is performed, an on voltage (Von) is provided to the select gate line SG, a ground voltage (0V) is provided to the bit line BL1 and the erase line EL1, and a program voltage (Vpp) is provided to the N-well region (NW) and the source line SL. For example, the program voltage (Vpp) is in the range between +3.0V and +9V, and the on voltage (Von) is 0V or Vpp/2. Consequently, the first p-type transistor M1 is turned on, and a program current flows from the source line SL to the bit line BL1 through the channel regions of the first p-type transistor M1 and the second p-type transistor M2, i.e., the channel regions under the two gate structures 230 and 240. When hot carriers (e.g., electrons) are transferred through the channel region of the second p-type transistor M2 (i.e., the channel region of the gate structure 240), the hot carriers are injected into the floating gate 242 through the gate oxide layer 241.

Figure 3B:
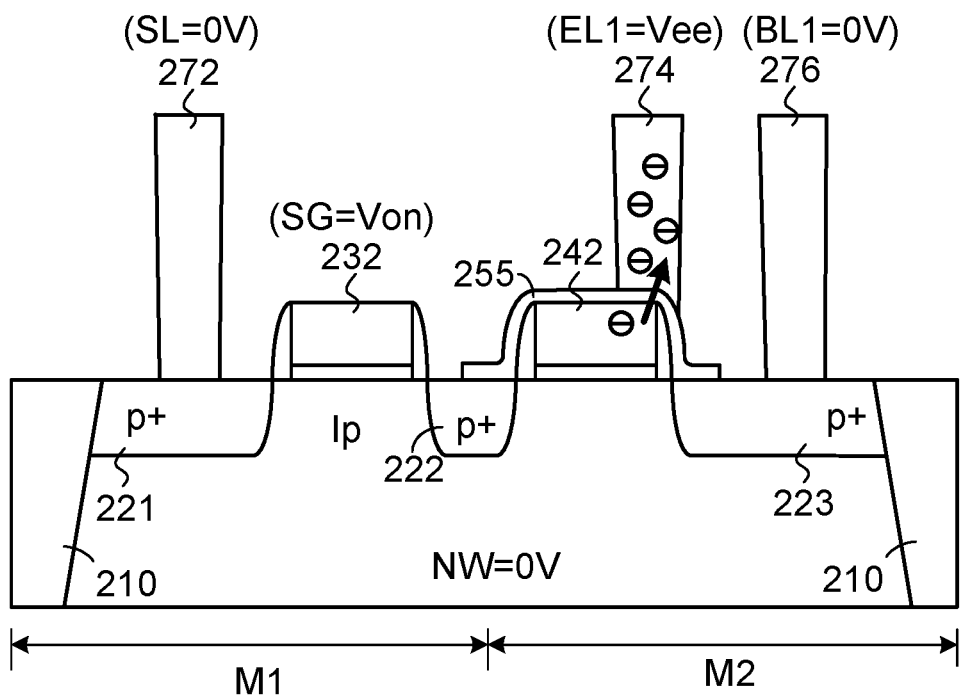

Please refer to FIG. 3B. While the erase operation is performed, the on voltage (Von) is provided to the select gate line SG, the ground voltage (0V) is provided to the bit line BL1, the source line SL and the N-well region (NW), and an erase voltage (Vee) is provided to the erase line EL1. For example, the erase voltage (Vee) is in the range between +6.5V and +20V, and the on voltage (Von) is 0V. As shown in FIG. 3B, when the erase line EL1 receives the erase voltage (Vee), the hot carriers stored in the floating gate 242 will be ejected from the floating gate 242, transferred to the erase line EL1 through the blocking layer 255, and departed from the memory cell of the non-volatile memory.

As mentioned above, the erase line EL1 is contacted with the blocking layer 255. Moreover, the erase line EL1 is located above the edge or the corner of the polysilicon gate 242 and not contacted with the polysilicon gate 242. During the erase operation, the edge of the floating gate 242 generates a point discharge effect. Consequently, the hot carriers are removed from the edge of the floating gate 242 to the erase line EL1 through the blocking layer 255 and departed from the memory cell of the non-volatile memory. In other words, during the erase operation, the hot carriers are ejected from the floating gate 242 to the erase line EL1 and an erase current is generated between the floating gate 242 and the erase line EL1 through the blocking layer 255.

Figure 3C:
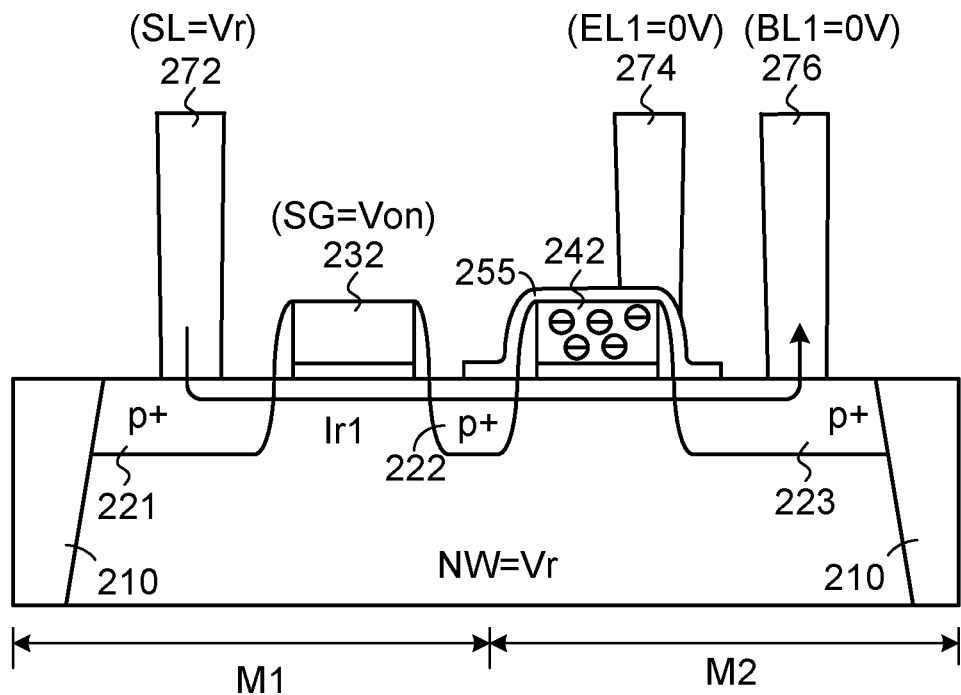
Figure 3D:
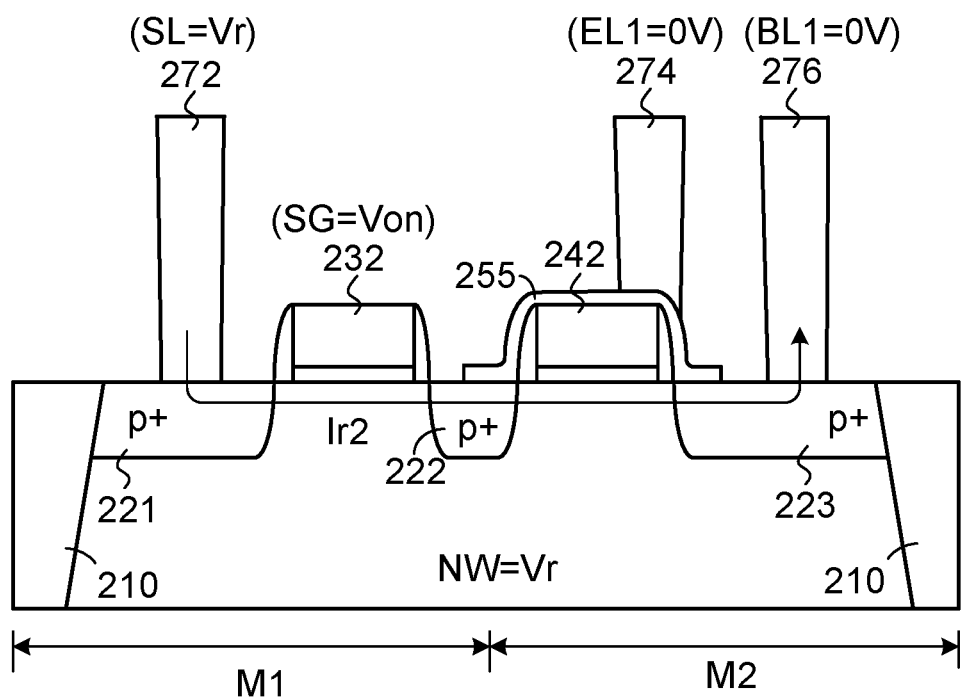

Please refer to FIGS. 3C and 3D. While the read operation is performed, the on voltage (Von) is provided to the select gate line SG, the ground voltage (0V) is provided to the bit line BL1, a read voltage (Vr) is provided to the source line SL and the N-well region (NW), and the ground voltage (0V) is provided to the erase line EL1. For example, the read voltage (Vr) is +1.8V, and the on voltage (Von) is 0V. Depending on the situation of whether the hot carriers are stored in the floating gate 242, different magnitudes of the read current are acquired. That is, during the read operation, the storage state of the memory cell can be realized according to the read current.

As shown in FIG. 3C, the first p-type transistor M1 is turned on during the read operation. Consequently, the read current Ir1 flows from the source line SL to the bit line BL1 through the channel regions of the first p-type transistor M1 and the second p-type transistor M2. Since hot carriers are stored in the floating gate 242, the magnitude of the read current Ir1 is larger (e.g., higher than 5 μA).

As shown in FIG. 3D, the first p-type transistor M1 is turned on during the read operation. Consequently, the read current Ir2 flows from the source line SL to the bit line BL1 through the channel regions of the first p-type transistor M1 and the second p-type transistor M2. Since hot carriers are not stored in the floating gate 242, the magnitude of the read current Ir2 is very small (e.g., about 0.1 μA).

In other words, the storage state of the memory cell can be judged according to the read current flowing through the bit line BL1 during the read operation. For example, a sensing circuit (not shown) of the non-volatile memory provides a reference current (e.g., 2 μA). According to the result of comparing the read current with the reference current, the sensing circuit determines the storage state of the memory cell.

If the read current is higher than the reference current, the sensing circuit judges that the memory cell is in a first storage state (e.g., the "0" state). Whereas, if the read current is lower than the reference current, the sensing circuit judges that the memory cell is in a second storage state (e.g., the "1" state). Consequently, the memory cell as shown in FIG. 3C is determined as the first storage state, and the memory cell as shown in FIG. 3D is determined as the second storage state.

It is noted that the values of the bias voltages are not restricted. That is, the bias voltages for performing the program operation, the erase operation and the read operation may be varied according to the practical requirements.

From the above descriptions, the present invention provides an erasable programmable non-volatile memory. In the memory cell of the non-volatile memory, the erase line is located above the edge or the corner of floating gate and not contacted with the floating gate. During the erase operation, a point discharge effect is generated. Consequently, the hot carriers are removed from the edge or the corner of the floating gate to the erase line through the blocking layer and departed from the memory cell of the non-volatile memory.

Figure 4A:
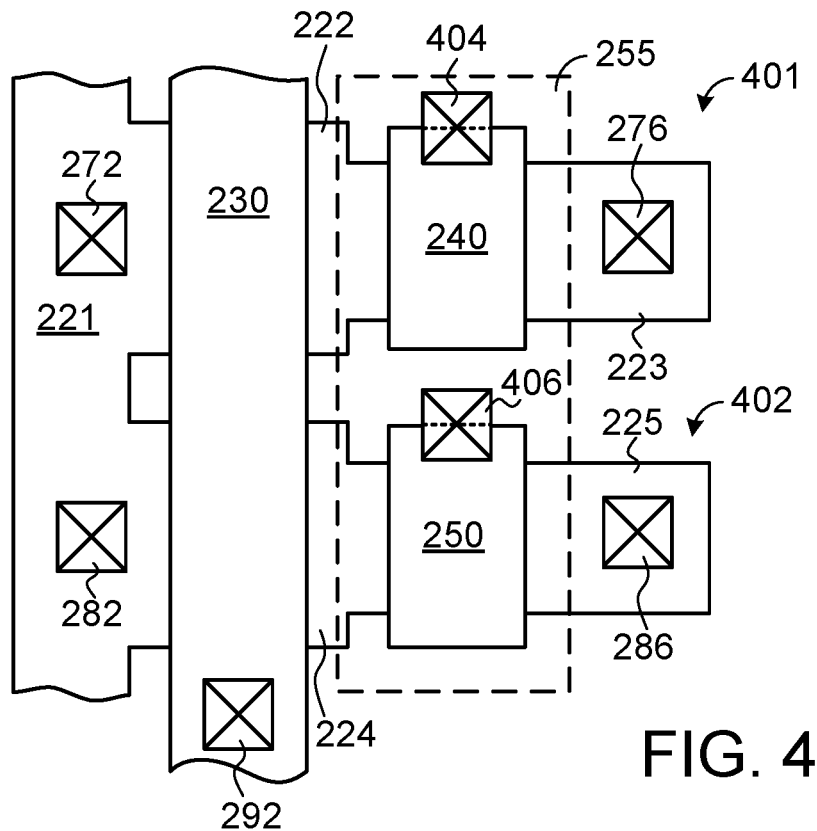
FIGS. 4A, 4B and 4C are schematic top views illustrating three variant examples of the erasable programmable non-volatile memory according to the embodiment of the present invention.
Figure 4B:
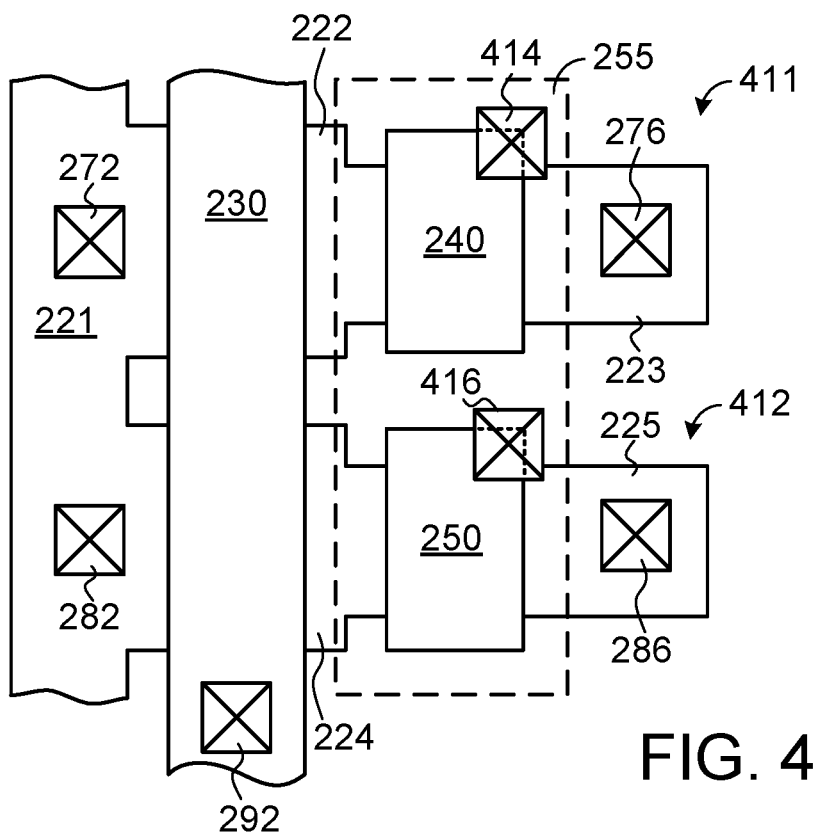
Figure 4C:
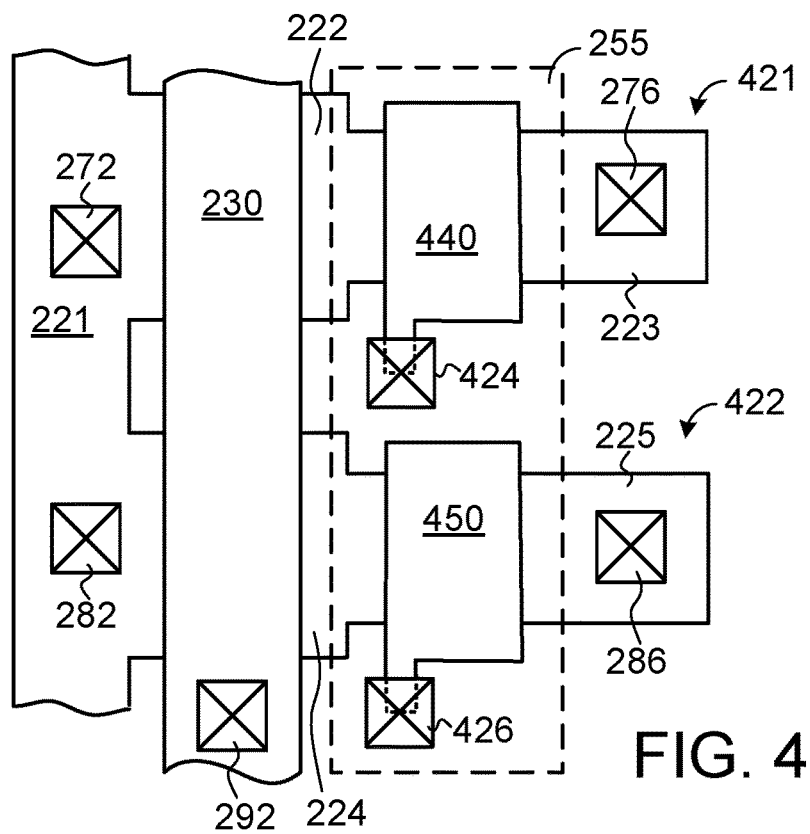

FIGS. 4A, 4B and 4C are schematic top views illustrating three variant examples of the erasable programmable non-volatile memory according to the embodiment of the present invention. In comparison with the embodiment of FIG. 2A, the installation positions of the metal conductor lines served as the erase lines are distinguished. For succinctness, only the installation positions of the erase lines of the memory cells will be described.

Please refer to FIG. 4A. In the memory cells 401 and 402, the contact holes corresponding to the metal conductor lines 404 and 406 are located above other edges of the gate structures 240 and 250, respectively. After the metal conductor lines 404 and 406 are filled in the contact holes, the metal conductor lines 404 and 406 are located above the corresponding edges of the gate structures 240 and 250 and not contacted with the gate structures 240 and 250.

Please refer to FIG. 4B. In the memory cells 411 and 412, the contact holes corresponding to the metal conductor lines 414 and 416 are located above the corresponding corners of the gate structures 240 and 250, respectively. After the metal conductor lines 414 and 416 are filled in the contact holes, the metal conductor lines 414 and 416 are located above the corresponding corners of the gate structures 240 and 250 and not contacted with the gate structures 240 and 250.

Please refer to FIG. 4C. The gate structure 440 of the memory cell 421 comprises a first protrusion part. The gate structure 450 of the memory cell 422 comprises a second protrusion part. The contact holes corresponding to the metal conductor lines 424 and 426 are located above the corresponding edges and corners of the first protrusion part and the second protrusion part, respectively. After the metal conductor lines 424 and 426 are filled in the contact holes, the metal conductor lines 424 and 426 are located above the corresponding edges and corners of the first protrusion part and the second protrusion part and not contacted with the gate structures 440 and 450.

As mentioned above, because of the point discharge effect, the hot carriers are ejected from the floating gate of the memory cell during the erase operation. However, if the metal conductor line served as the erase line is located above a middle region of the floating gate and not located above the edge or the corner of the floating gate, the point discharge effect is not generated during the erase operation. Consequently, the hot carriers cannot be ejected from the floating gate.

Figure 5:
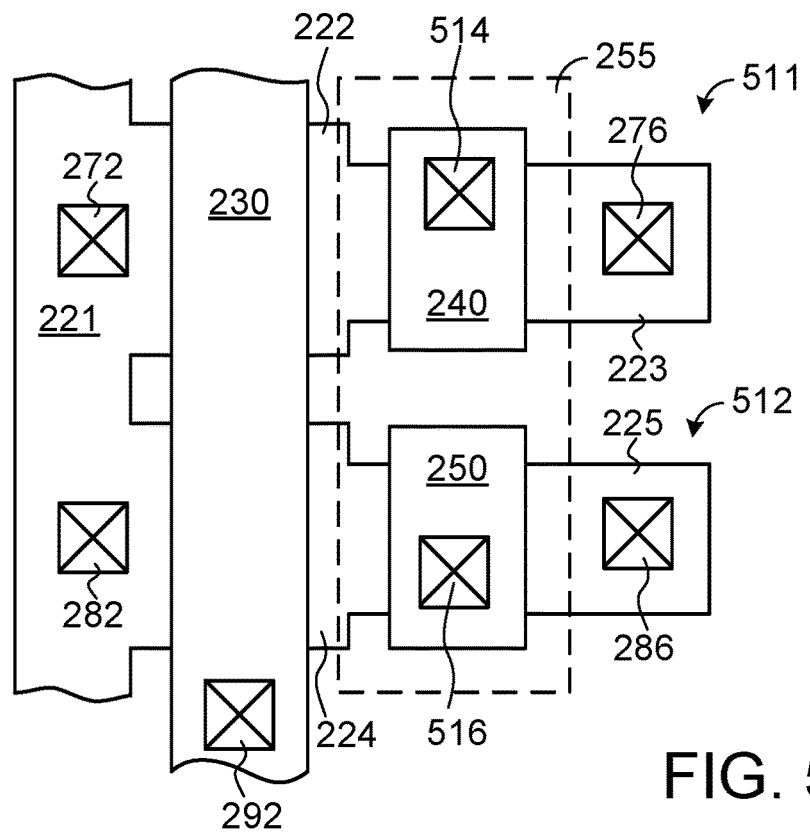
FIG. 5 is a schematic top view illustrating a non-volatile memory that is unable to undergo the erase operation.

FIG. 5 is a schematic top view illustrating a non-volatile memory that is unable to undergo the erase operation. In the memory cells 511 and 512, the metal conductor lines 514 and 516 are not located above the edges or corners of the floating gates. Since the erase operation fails, the hot carriers in the floating gates cannot be effectively ejected from the floating gates of the memory cells 511 and 512.

From the above descriptions, the present invention provides an erasable programmable non-volatile memory with a novel structure and a smaller size. The metal conductor line served as the erase line is located above the edge or the corner of the floating gate. Consequently, the size of the memory cell is effectively reduced. Moreover, because of the point discharge effect, the hot carriers can be smoothly ejected from the floating gate of the memory cell during the erase operation.

In the above embodiments, the memory cell of the non-volatile memory with two p-type transistors are taken as an example. It is noted that numerous modifications and alterations may be made while retaining the teachings of the invention. In another embodiment, the memory cell of the non-volatile memory comprises two n-type transistors. For example, three n-type doped regions are formed in the surface of a p-well region (PW), and the structure of the memory cell is similar to that of FIG. 2A.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable non-volatile memory, comprising:
   a first-type well region;
   a first doped region, a second doped region and a third doped region, which are formed in a surface of the first-type well region, wherein the first doped region is connected with a source line, and the third doped region is connected with a bit line;
   a first gate structure spanned over an area between the first doped region and the second doped region, wherein a first polysilicon gate of the first gate structure is connected with a select gate line;
   a second gate structure spanned over an area between the second doped region and the third doped region, wherein a second polysilicon gate of the second gate structure is a floating gate;
   a blocking layer formed on the second gate structure and contacted with the second polysilicon gate, the second doped region and the third doped region;
   a contact hole formed over the blocking layer and located above an edge or a corner of the floating gate; and
   a metallic material filled in the contact hole for conducting plural hot carriers ejected from the edge or the corner of the floating gate during an erase operation.

2. The erasable programmable non-volatile memory as claimed in claim 1, wherein an opening of the contact hole is located above the edge or the corner of the floating gate, the metallic material is a metal conductor line served as an erase line, the erase line is contacted with the blocking layer, and the erase line is located above the edge or the corner of the floating gate.

3. The erasable programmable non-volatile memory as claimed in claim 2, wherein during a program operation, a program voltage is provided to the source line and the first-type well region, a ground voltage is provided to the erase line and the bit line, and an on voltage is provided to the select gate line, wherein during the program operation, a program current flows from the source line to the bit line through channel regions underlying the first gate structure and the second gate structure, so that the hot carriers are injected into the floating gate.

4. The erasable programmable non-volatile memory as claimed in claim 3, wherein during the erase operation, the ground voltage is provided to the source line, the first-type well region and the bit line, an erase voltage is provided to the erase line, and the on voltage is provided to the select gate line, so that the hot carriers are ejected from the floating gate to the erase line through the blocking layer.

5. The erasable programmable non-volatile memory as claimed in claim 4, wherein during the erase operation, an erase current is generated between the floating gate and the erase line through the blocking layer.

6. The erasable programmable non-volatile memory as claimed in claim 3, wherein during a read operation, a read voltage is provided to the source line and the first-type well region, the ground voltage is provided to the erase line and the bit line, and the on voltage is provided to the select gate line, wherein during the read operation, a read current flows from the source line to the bit line through the channel regions underlying the first gate structure and the second gate structure.

7. The erasable programmable non-volatile memory as claimed in claim 6, wherein a storage state of the erasable programmable non-volatile memory is determined according to a result of comparing the read current with a reference current.

8. The erasable programmable non-volatile memory as claimed in claim 1, wherein the blocking layer is a salicide blocking layer.

9. The erasable programmable non-volatile memory as claimed in claim 1, wherein the blocking layer is a silicon dioxide layer, a stack structure comprising a silicon dioxide layer and a silicon nitride layer, or a stack structure comprising a silicon dioxide layer, a silicon nitride layer and a silicon oxynitride layer.

10. The erasable programmable non-volatile memory as claimed in claim 1, wherein the first-type well region is an n-type well region, and the first doped region, the second doped region and the third doped region are p-type doped regions.

* * * * *